US012782303B2

(12) United States Patent
Kim et al.

(10) Patent No.: US 12,782,303 B2
(45) Date of Patent: Nov. 3, 2026

(54) SUBSTRATE INSPECTION APPARATUS AND A METHOD OF INSPECTING A SUBSTRATE USING THE SAME

(71) Applicant: SAMSUNG ELECTRONICS CO., LTD., Suwon-si (KR)

(72) Inventors: Kwang-Eun Kim, Suwon-si (KR); Sewon Kim, Suwon-si (KR); Seo Young Park, Suwon-si (KR); Jeongho Ahn, Suwon-si (KR); Sungeun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 304 days.

(21) Appl. No.: 18/241,570

(22) Filed: Sep. 1, 2023

(65) Prior Publication Data

US 2024/0151664 A1 May 9, 2024

(30) Foreign Application Priority Data

Nov. 7, 2022 (KR) ........................ 10-2022-0147239
Mar. 22, 2023 (KR) ........................ 10-2023-0037184

(51) Int. Cl.
*G01N 23/2251* (2018.01)
*H01J 37/06* (2006.01)
(Continued)

(52) U.S. Cl.
CPC .......... *G01N 23/2251* (2013.01); *H01J 37/06* (2013.01); *H01J 37/1472* (2013.01); *H01J 37/244* (2013.01); *H01J 37/28* (2013.01)

(58) Field of Classification Search
CPC .......... H01J 37/00; H01J 37/02; H01J 37/244; H01J 37/26; H01J 37/28; H01J 37/265;
(Continued)

(56) References Cited

U.S. PATENT DOCUMENTS 5,665,968 A * 9/1997 Meisburger ......... H01J 37/3005 250/306
5,945,677 A * 8/1999 Leung ................. H01J 37/3177 250/398
(Continued)

FOREIGN PATENT DOCUMENTS

JP 2005-277046 A 10/2005
JP 4332922 B2 9/2009
(Continued)

*Primary Examiner* — Jason L McCormack
(74) *Attorney, Agent, or Firm* — Sughrue Mion, PLLC

(57) ABSTRACT

A method of inspecting a substrate includes providing a substrate on a test stage, the substrate including a plurality of regions, and scanning the substrate using a scanning electron microscope (SEM) column, where the scanning of the substrate includes scanning a first region of the plurality of regions of the substrate, after scanning the first region, scanning a second region of the plurality of regions of the substrate, the second region being spaced apart from the first region, and after scanning the second region, scanning a third region of the plurality of regions of the substrate, the third region being between the first region and the second region, and where the third region is adjacent to the first region.

13 Claims, 12 Drawing Sheets

(51) Int. Cl.
*H01J 37/147* (2006.01)
*H01J 37/244* (2006.01)
*H01J 37/28* (2006.01)

(58) Field of Classification Search
CPC ... H01J 37/06; H01J 37/1472; G01N 23/2251
USPC .......................................... 250/306, 307, 311
See application file for complete search history.

(56) References Cited

U.S. PATENT DOCUMENTS

| | | | | |
|---|---|---|---|---|
| 6,586,736 | B1 | 7/2003 | McCord | |
| 8,362,425 | B2 | 1/2013 | Han et al. | |
| 10,256,068 | B2 | 4/2019 | Enyama et al. | |
| 11,335,535 | B2 | 5/2022 | Nakamura et al. | |
| 2016/0351373 | A1* | 12/2016 | Xiao | H01J 37/1472 |
| 2017/0040228 | A1 | 2/2017 | Montgomery et al. | |
| 2021/0020422 | A1* | 1/2021 | Nakamura | H01J 37/265 |
| 2024/0038482 | A1* | 2/2024 | Foca | H01J 37/1474 |

FOREIGN PATENT DOCUMENTS

| | | | |
|---|---|---|---|
| JP | 4972262 | B2 | 7/2012 |
| JP | 2021-197264 | A | 12/2021 |
| KR | 10-2018-0062604 | A | 6/2018 |

* cited by examiner

SUBSTRATE INSPECTION APPARATUS AND A METHOD OF INSPECTING A SUBSTRATE USING THE SAME

CROSS-REFERENCE TO RELATED APPLICATIONS

This application is based on and claims priority to Korean Patent Application 10-2023-0037184, filed Mar. 22, 2023, and Korean Patent Application No. 10-2022-0147239, filed on Nov. 7, 2022, in the Korean Intellectual Property Office, the disclosures of which are incorporated herein by reference in their entireties.

BACKGROUND

1. Field

Example embodiments of the disclosure relate to a substrate inspection apparatus and a method of inspecting a substrate using the same, and more particularly, to a substrate inspection apparatus capable of preventing a charge accumulation phenomenon and a method of inspecting a substrate using the same.

2. Description of Related Art

A semiconductor device may be manufactured by various processes. For example, the semiconductor device may be manufactured by a photolithography process, an etching process, a deposition process and a test process. Such processes may be performed on a wafer (e.g., a silicon wafer). In the test process, performance of the semiconductor device may be tested. Various apparatuses may be used to test the semiconductor device. For example, a scanning electron microscope (SEM) may be used to test the semiconductor device.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments of the disclosure provide a substrate inspection apparatus capable of preventing deformation of a photoresist (PR) by securing a time for which charges escape, and a method of inspecting a substrate using the same.

One or more example embodiments of the disclosure provide a substrate inspection apparatus capable of obtaining an accurate test result, and a method of inspecting a substrate using the same.

One or more example embodiments of the disclosure provide a substrate inspection apparatus capable of quickly performing a test, and a method of inspecting a substrate using the same.

Additional aspects will be set forth in part in the description which follows and, in part, will be apparent from the description, or may be learned by practice of the presented embodiments.

According to an aspect of an example embodiment, a method of inspecting a substrate may include providing a substrate on a test stage, the substrate including a plurality of regions, and scanning the substrate using a scanning electron microscope (SEM) column, where the scanning of the substrate may include scanning a first region of the plurality of regions of the substrate, after scanning the first region, scanning a second region of the plurality of regions of the substrate, the second region being spaced apart from the first region, and after scanning the second region, scanning a third region of the plurality of regions of the substrate, the third region being between the first region and the second region, and where the third region is adjacent to the first region.

According to an aspect of an example embodiment, a method of inspecting a substrate may include providing a wafer on a test stage, the wafer including a plurality of regions, scanning the wafer using an SEM column, and forming an image using data generated based on results of the scanning of the wafer, where the scanning of the wafer may include a first scanning of each of the plurality of regions of the wafer, and after the first scanning of each of the plurality of regions of the wafer is completed, a second scanning of each of the plurality of regions of the wafer.

According to an aspect of an example embodiment, a substrate inspecting apparatus may include an SEM column including an SEM housing including a beam generation space, an electron gun in the beam generation space and a deflector under the electron gun, where the deflector may include a first deflector configured to cause an electron beam emitted from the electron gun to travel along a first path, and a second deflector configured to cause the electron beam emitted from the electron gun to travel along a second path that is different from the first path.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
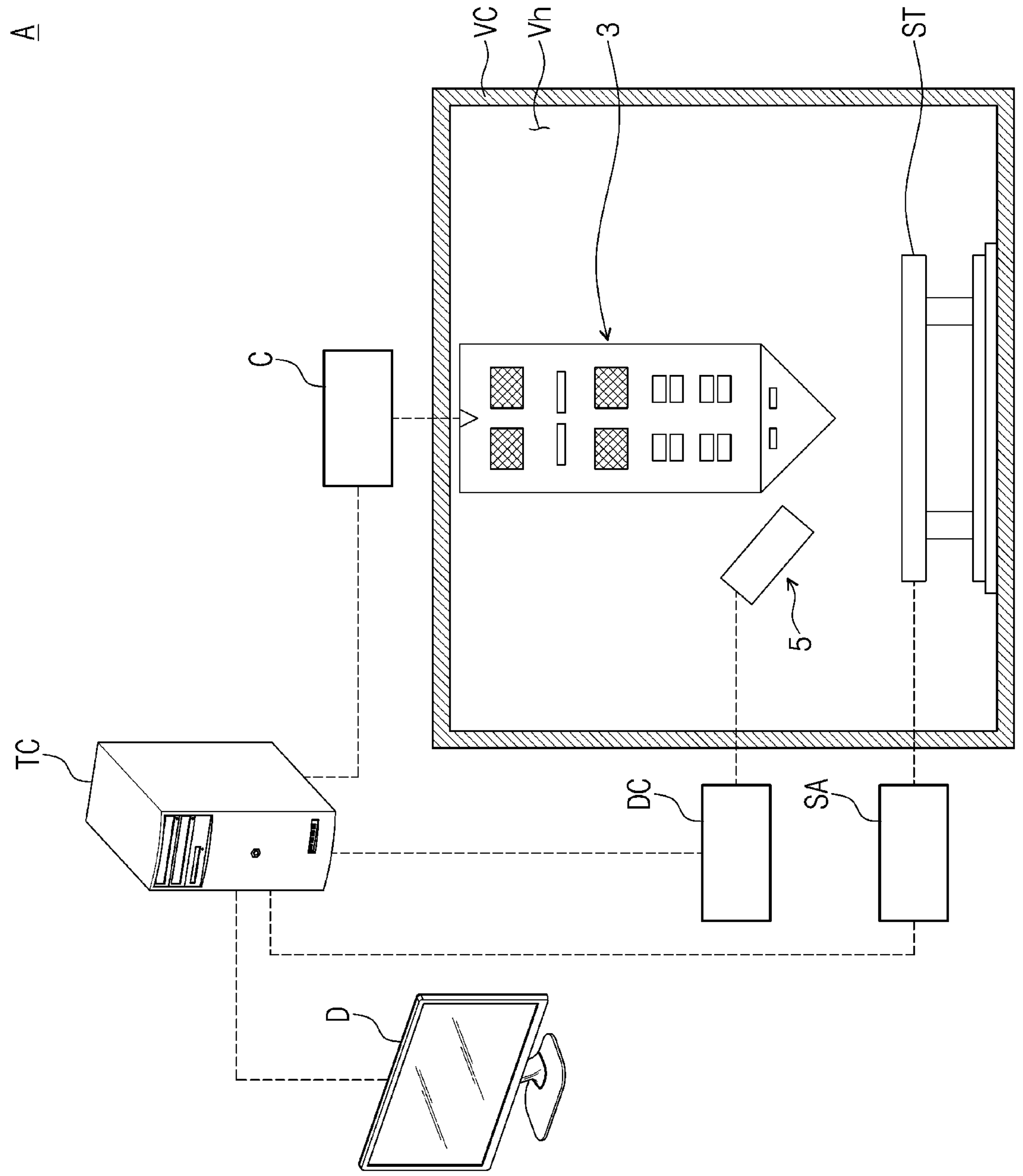
FIG. 1 is a diagram illustrating a substrate inspection apparatus according to some embodiments of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram illustrating a substrate inspection apparatus according to some embodiments of the disclosure.

Referring to FIG. 1, a substrate inspection apparatus A may be provided. The substrate inspection apparatus A may be an apparatus capable of inspecting or detecting failure of a substrate. More particularly, the substrate inspection apparatus A may inspect or detect electrical failure of the substrate. The term "substrate" may refer to a semiconductor device. More particularly, the substrate may include a silicon wafer. However, embodiments of the disclosure are not limited thereto, and in some embodiments, the substrate inspection apparatus A may be used to inspect a substrate having another shape or another composition. For example, the substrate inspection apparatus A may be used to inspect a semiconductor device implemented as an individual die by a dividing process (e.g., a sawing process).

The substrate inspection apparatus A may include a vacuum chamber VC, a scanning electron microscope (SEM) column 3, a test stage ST, a detector 5, a test stage driving unit SA, an SEM control unit C, a detector control unit DC, a total control unit TC, and a display D.

The vacuum chamber VC may include an inspection space Vh. The inspection space Vh may be maintained in a vacuum state. To achieve this, a vacuum pump connected to the inspection space Vh may be provided. The substrate may be disposed or loaded in the vacuum chamber VC. More particularly, the substrate may be disposed or loaded on the test stage ST in the vacuum chamber VC.

At least a portion of the SEM column 3 may be located in the vacuum chamber VC. The SEM column 3 may include an SEM. The SEM column 3 may be configured to emit an electron beam toward the substrate on the test stage ST. The SEM column 3 may emit the electron beam to the substrate to charge a conductor (e.g., an electrode) in the substrate. In other words, the SEM column 3 may be configured to emit a charged electron beam. For example, the electrode in the substrate to which the electron beam having a secondary electron yield greater than 1 is emitted may be charged with positive (+) charges. Alternatively, the electrode in the substrate to which the electron beam having the secondary electron yield less than 1 is emitted may be charged with negative (−) charges. The SEM column 3 may be configured to emit a scanning electron beam toward the substrate on the test stage ST. The electrode of the substrate charged by the charged electron beam may be scanned by the scanning electron beam.

A single SEM column is illustrated and described in FIG. 1, but embodiments of the disclosure are not limited thereto. In some embodiments, two SEM columns may be provided. In this case, the charged electron beam may be emitted by one of the two SEM columns, and the scanning electron beam may be emitted by the other of the two SEM columns.

The test stage ST may be located under the SEM column 3. The test stage ST may support the substrate. The substrate may be disposed on a top surface of the test stage ST. The test stage ST may include a chuck for fixing the substrate. For example, the test stage ST may include an electrostatic chuck configured to fix the substrate using electrostatic force, or a vacuum chuck configured to fix the substrate using vacuum pressure. The test stage ST may be movable in a horizontal direction with respect to the SEM column 3. Thus, the substrate on the test stage ST may also be movable in the horizontal direction with respect to the SEM column 3.

The detector 5 may be configured to detect secondary electrons and/or backscatter electrons, generated by the electron beam. For example, the detector 5 may detect secondary electrons generated from the substrate irradiated by the scanning electron beam. Data on the secondary electrons detected by the detector 5 may be transmitted to the total control unit TC.

The test stage driving unit SA may be configured to move the test stage ST. For example, the test stage driving unit SA may move the test stage ST, on which the substrate is disposed, in the horizontal direction.

The SEM control unit C may be configured to control the SEM column 3. For example, the SEM control unit C may control an irradiation angle, the secondary electron yield and an irradiation time of the electron beam emitted by the SEM column 3. In addition, the SEM control unit C may control a path of the electron beam emitted by the SEM column 3. This will be described later in more detail.

The detector control unit DC may be configured to control the detector 5. The detector control unit DC may transmit data detected from the detector 5 to the total control unit TC. The total control unit TC may control the SEM control unit C, the detector control unit DC, and the test stage driving unit SA. The total control unit TC may form an image using the data on the secondary electrons received from the detector control unit DC. For example, the total control unit TC may form a voltage contrast image (VC image). Alternatively, the total control unit TC may form numerical data on the amount of the secondary electrons using the data on the secondary electrons received from the detector control unit DC. In other words, the total control unit TC may form numerical data on electrical signals by the secondary electrons received from the detector control unit DC. The display D may be connected to the total control unit TC. The display D may output the image formed by the total control unit TC. A user may check the image outputted in the display D to determine the status of the substrate (e.g., failure, success, etc.).

Figure 2:
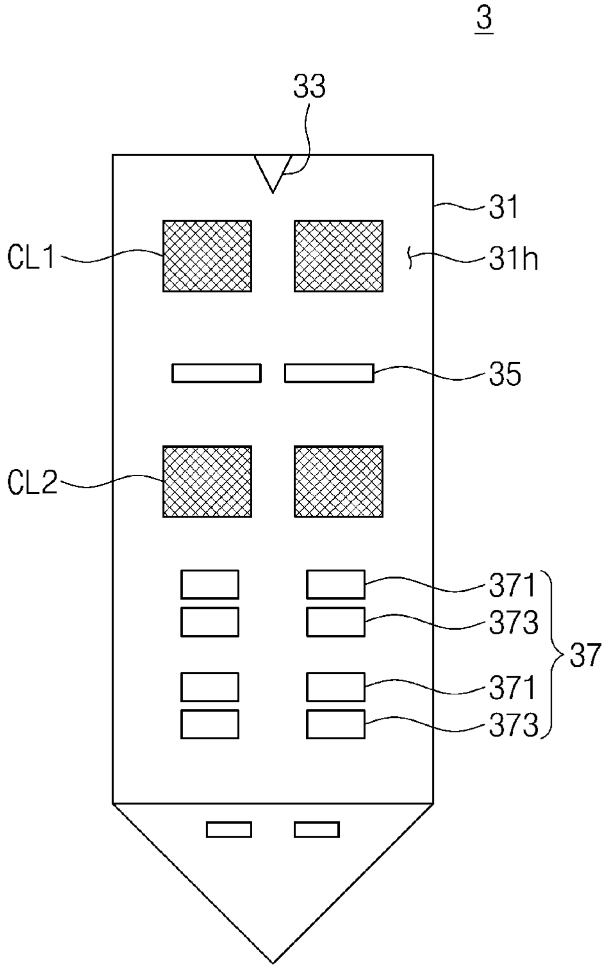
FIG. 2 is a diagram illustrating a scanning electron microscope (SEM) column according to some embodiments of the disclosure.

FIG. 2 is a diagram illustrating an SEM column according to some embodiments of the disclosure.

Referring to FIG. 2, the SEM column 3 may include an SEM housing 31, an electron gun 33, a first condenser lens CL1, a second condenser lens CL2, a deflector 37, and a blocking deflector 35.

The SEM housing 31 may include a beam generation space 31*h*. The SEM housing 31 may protect the electron gun 33.

The electron gun 33 may be located in the beam generation space 31*h*. The electron gun 33 may be configured to emit an electron beam. The electron beam emitted from the electron gun 33 may move to the outside of the SEM housing 31 through the deflector 37.

The first condenser lens CL1 may be located under the electron gun 33. The second condenser lens CL2 may be located under the first condenser lens CL1. Two condenser lenses are illustrated and described in FIG. 2, but embodiments of the disclosure are not limited thereto.

The deflector 37 may be located under the electron gun 33. More particularly, the deflector 37 may be located under the first condenser lens CL1 and/or the second condenser lens CL2. The deflector 37 may be configured to bend or change a path of the electron beam emitted from the electron gun 33. For example, the path of the electron beam emitted downward from the electron gun 33 and traveling straight may be bent or changed while the electron beam passes through the deflector 37. Thus, the deflector 37 may direct the electron beam to a desired place. The deflector 37 may be provided in plurality. For example, as shown in FIG. 2, the deflector 37 may include a first deflector 371 and a second deflector 373. The first deflector 371 may cause the electron beam emitted from the electron gun 33 to travel along a first path. To achieve this, the first deflector 371 may include an electromagnet and/or an electric condenser. However, embodiments of the disclosure are not limited thereto, and in some embodiments, the first deflector 371 may include other structure(s) capable of changing the path of the electron beam. The second deflector 373 may cause the electron beam emitted from the electron gun 33 to travel along a second path. The second path may be different from the first path. To achieve this, the second deflector 373 may include an electromagnet and/or an electric condenser. However, embodiments of the disclosure are not limited thereto, and in some embodiments, the second deflector 373 may include other structure(s) capable of changing the path of the electron beam.

The blocking deflector 35 may be located between the electron gun 33 and the deflector 37. For example, the blocking deflector 35 may be located between the first condenser lens CL1 and the deflector 37. The blocking deflector 35 may be configured to selectively block the electron beam emitted from the electron gun 33. To achieve this, the blocking deflector 35 may include an electromagnet and/or an electric condenser. The blocking deflector 35 will be described later in more detail.

Figure 3:
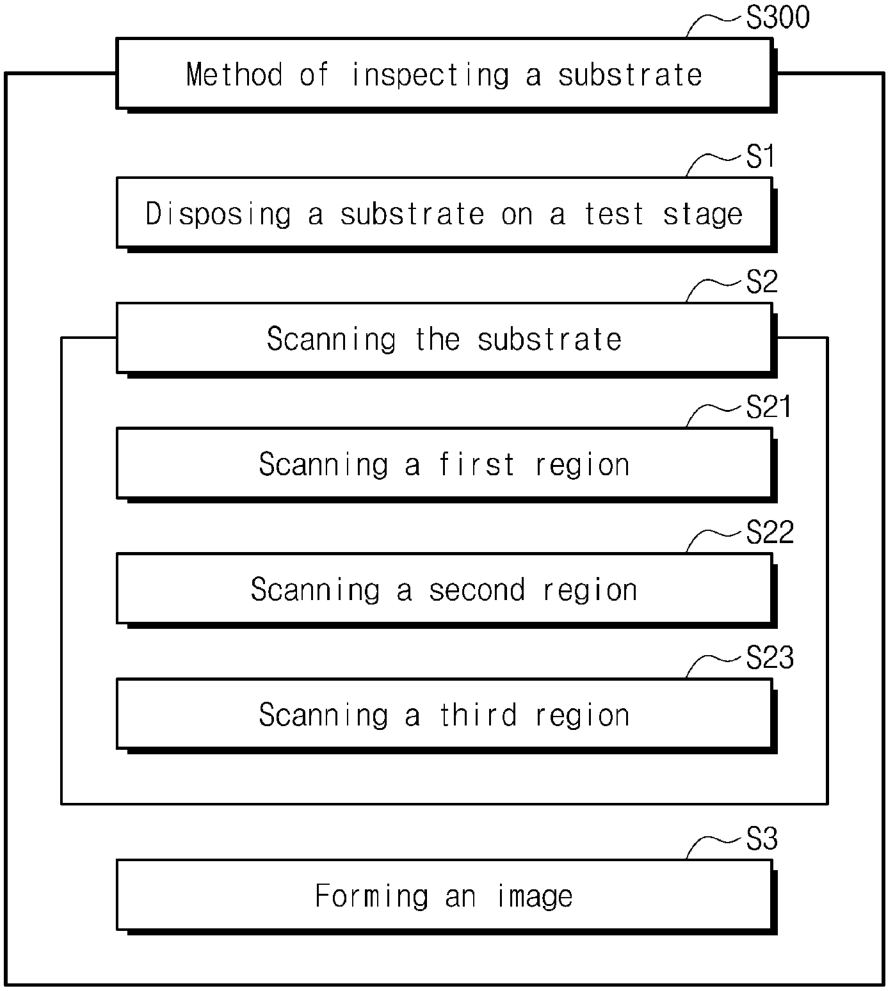
FIG. 3 is a flowchart illustrating a method of inspecting a substrate according to some embodiments of the disclosure.

FIG. 3 is a flowchart illustrating a method of inspecting a substrate according to some embodiments of the disclosure.

Referring to FIG. 3, a method S300 of inspecting a substrate may be provided. The method S300 of inspecting a substrate may be implemented using the substrate inspection apparatus A (see FIG. 1) described with reference to FIGS. 1 and 2. The method S300 of inspecting a substrate may include disposing a substrate on a test stage in operation S1, scanning the substrate in operation S2, and forming an image in operation S3.

The scanning of the substrate of operation S2 may include scanning a first region in operation S21, scanning a second region in operation S22, and scanning a third region in operation S23.

Hereinafter, the method S300 of inspecting a substrate of FIG. 3 will be described in detail with reference to FIGS. 4-7.

FIGS. 4, 5, 6 and 7 are diagrams illustrating the method of inspecting a substrate in the flowchart of FIG. 3, according to some embodiments of the disclosure.

Figure 4:
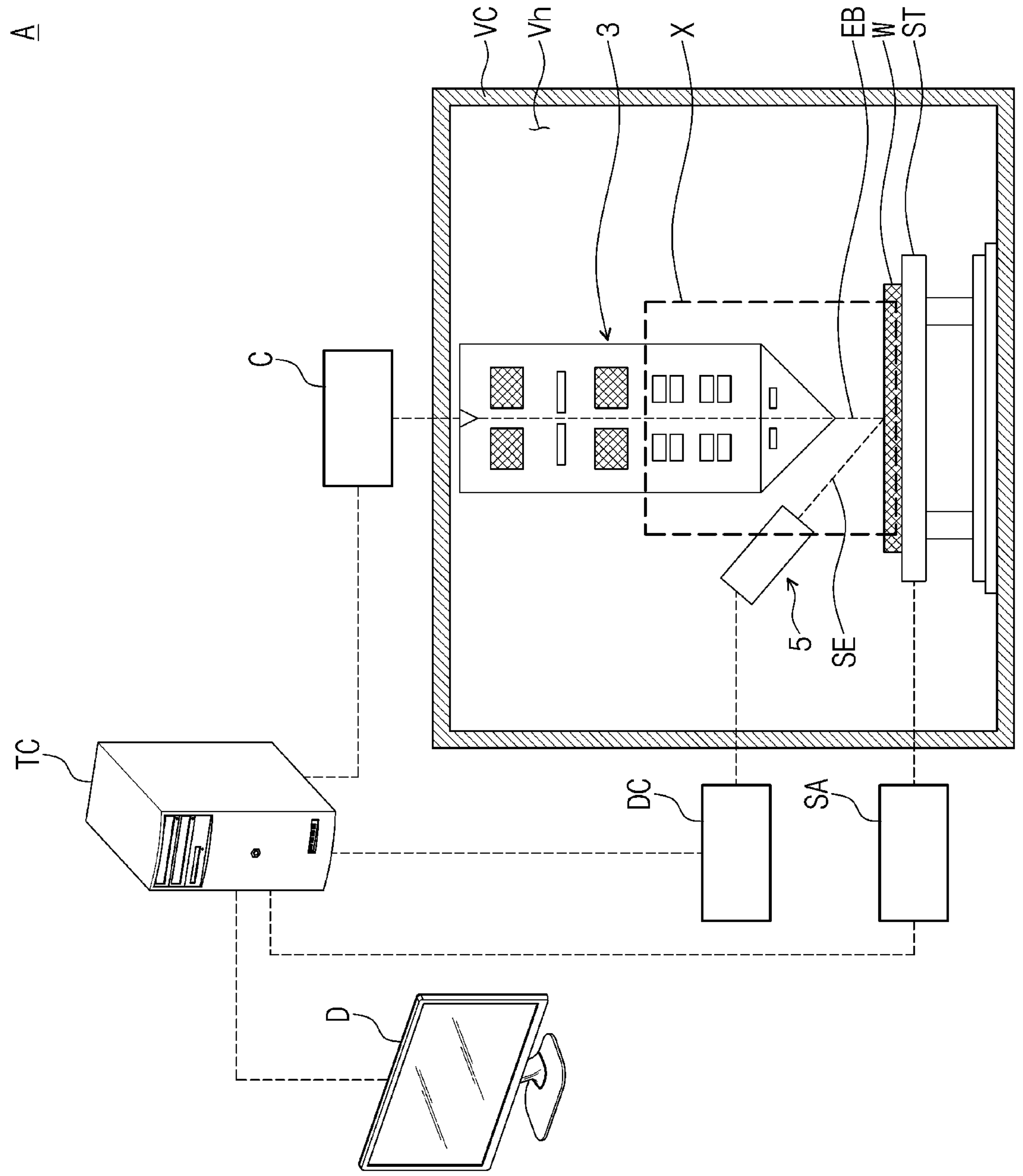
FIGS. 4, 5, 6 and 7 are diagrams illustrating the method of inspecting a substrate in the flowchart of FIG. 3, according to some embodiments of the disclosure.

Referring to FIGS. 3 and 4, the disposing of the substrate on the test stage of operation S1 may include loading a substrate W in the vacuum chamber VC. The substrate W may include a semiconductor device in a wafer level, but embodiments of the disclosure are not limited thereto. The substrate W may be fixed on the test stage ST.

Figure 5:
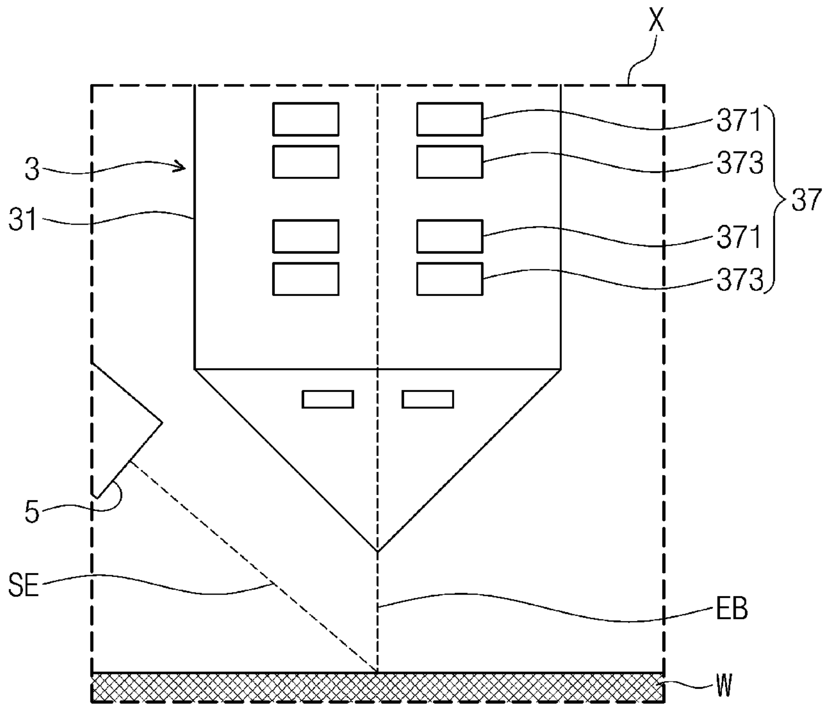

Referring to FIG. 5, an electron beam EB may be emitted onto the substrate W. The electron beam EB may reach a specific position on the substrate W through the deflector 37. The deflector 37 may bend or change a path of the electron beam EB to control the path of the electron beam EB in such a way that the electron beam EB reaches the specific position on the substrate W. For example, the first deflector 371 may cause the electron beam EB may move along the first path to reach the substrate W. At this time, the second deflector 373 may not operate. After a predetermined amount of time, the second deflector 373 may cause the electron beam EB may move along the second path to reach the substrate W. At this time, the first deflector 371 may not operate. When the electron beam EB is applied to the substrate W, secondary electrons SE may be emitted from the substrate W. The detector 5 may detect the secondary electrons SE emitted from the substrate W.

Figure 6:
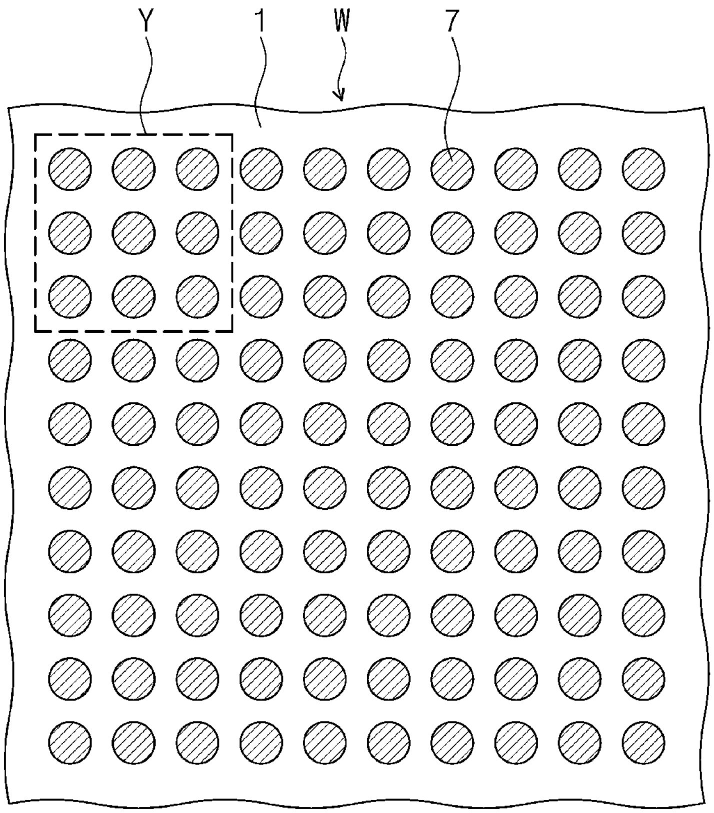

Referring to FIG. 6, the substrate W may include a plurality of regions 7. Each of the plurality of regions 7 may be an inspection target. For example, each of the plurality of regions 7 may include a capacitor of a dynamic random access memory (DRAM) device or a gate contact of a metal-oxide-semiconductor field-effect transistor (MOSFET). Alternatively, each of the plurality of regions 7 may include a pad of a semiconductor package. However, embodiments of the disclosure are not limited thereto, and in some embodiments, the plurality of regions 7 may include other components. The plurality of regions 7 may be surrounded by a peripheral region 1 in a plan view. The peripheral region 1 may mean a region which is not the inspection target. For example, the peripheral region 1 may include a photoresist (PR). In other words, the peripheral region 1 may be a region covered with the PR. However, embodiments of the disclosure is not limited thereto, and in certain embodiments, the peripheral region 1 may include other material. As shown in FIG. 6, a section Y of 9 regions is shown. Section Y is further depicted in FIG. 7.

Figure 7:
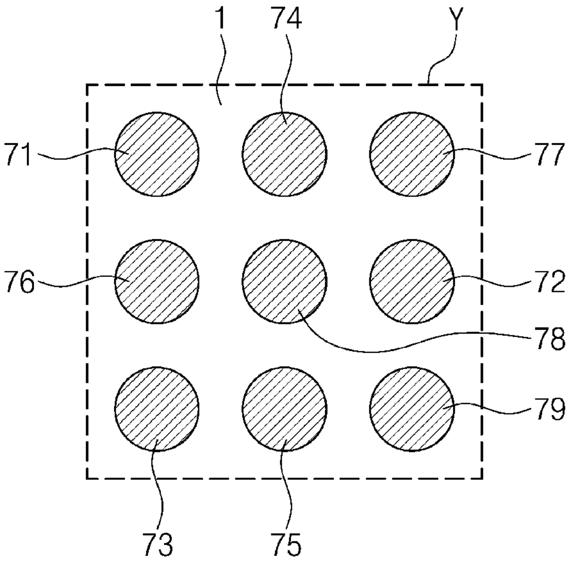

Referring to FIG. 7, for example, the plurality of regions in section Y (see FIG. 6) may include a first region 71, a second region 72, a third region 73, a fourth region 74, a fifth region 75, a sixth region 76, a seventh region 77, an eighth region 78, and a ninth region 79. The electron beam may be emitted in order from the first region 71 to the ninth region 79. In other words, the SEM column 3 (see FIG. 4) may scan the substrate W in order from the first region 71 to the ninth region 79. The first region 71 to the ninth region 79 may not be arranged in a linear form. In other words, the substrate W may be scanned along a non-linear trajectory.

Referring to FIGS. 3 and 7, the scanning of the first region of operation S21 may include emitting an electron beam to the first region 71, and detecting particles emitted from the first region 71. The emitting of the electron beam to the first region 71 may include emitting the electron beam EB (see FIG. 5), emitted along the first path as caused by the first deflector 371 (see FIG. 5), onto the first region 71. In this process, the second deflector 373 may not operate. The first deflector 371 may cause the electron beam emitted from the electron gun 33 (see FIG. 5) to move along the first path. The detecting of the particles emitted from the first region 71 may include detecting secondary electrons emitted from the first region 71.

The scanning of the second region of operation S22 may include emitting an electron beam to the second region 72, and detecting particles emitted from the second region 72. The scanning of the second region of operation S22 may be performed after the scanning of the first region of operation S21 is completed. The second region 72 may be spaced apart from the first region 71. In other words, the first region 71 and the second region 72 may not be adjacent to each other. In other words, another region or regions may be positioned between the first region 71 and the second region 72. Put alternatively, the region that is scanned second may not be a region that is adjacent to a region that is scanned previously, such that another region is positioned between the region scanned first and the region scanned second. For example, when viewing first region 71 and second region 72, other regions, such as regions 74, 78, and 75, are between the first region 71 and the second region 72, such that the first region 71 and the second region 72 may not be considered to be adjacent (i.e., both spaced apart and not adjacent).

The emitting of the electron beam to the second region 72 may include emitting the electron beam EB (see FIG. 5), emitted along the second path as caused by the second deflector 373 (see FIG. 5), onto the second region 72. In this process, the first deflector 371 may not operate. The second deflector 373 may cause the electron beam emitted from the electron gun 33 (see FIG. 5) to move along the second path by. In other words, the second path may be activated using the first deflector 371 and the second deflector 373. More particularly, after the emitting of the electron beam to the first region 71, the electron beam emitted from the electron gun 33 may be blocked using the blocking deflector 35 (see FIG. 2). Thereafter, the operation of the first deflector 371 may be stopped. In addition, the second deflector 373 may be operated. Thus, the second path may be activated. When the second path is activated, the blocking deflector 35 may be opened to allow the electron beam emitted from the electron gun 33 to be emitted along the second path. The detecting of the particles emitted from the second region 72 may include detecting secondary electrons emitted from the second region 72.

The scanning of the third region of operation S23 may include emitting an electron beam to the third region 73, and detecting secondary electrons emitted from the third region 73. The scanning of the third region of operation S23 may be performed after the scanning of the second region of operation S22 is completed. The third region 73 may be spaced apart from the second region 72. In other words, the third region 73 and the second region 72 may not be adjacent to each other (i.e., intermediate regions may be present between the second region 72 and the third region 73 as described above and shown in the figures). In other words, another region or regions may be positioned between the third region 73 and the second region 72.

Scanning processes may be performed on the fourth region 74, the fifth region 75, the sixth region 76, the seventh region 77, the eighth region 78 and the ninth region 79 by the method described above. At this time, two regions continuously irradiated by the electron beam may not be adjacent to each other. In other words, the scanning processes may be performed along a non-linear path.

Referring again to FIG. 3, the forming of the image of operation S3 may include forming an image using data on scanning results of each of the first region 71 to the ninth region 79.

According to the substrate inspection apparatus and the method of inspecting a substrate using the same in the embodiments of the disclosure, a plurality of regions may be scanned in a non-linear order. For example, the electron beam may be emitted to a first region, and then, the electron beam may be emitted to a region adjacent to the first region after a predetermined amount of time. Between the emitting of the electron beam to the first region and the emitting of the electron beam to the adjacent region, the electron beam may be emitted to a region spaced apart from the first region and the adjacent region. Thus, the electron beam may be prevented from being continuously emitted to the first region and the region adjacent to the first region. For example, the PR may be located between two regions adjacent to each other. The electron beam may be prevented from being continuously emitted to the PR. Thus, charges may be prevented from being accumulated in the PR. In other words, a time for which the charges emitted to the PR escape from the PR may be secured. If the charges are accumulated in the PR, deformation (e.g., shrinkage of the PR) may be caused. According to the disclosure, the deformation (e.g., the shrinkage of the PR) may be prevented. Thus, accurate test results may be obtained.

According to the substrate inspection apparatus and the method of inspecting a substrate using the same in the embodiments of the disclosure, two or more paths may be implemented in the single SEM column using the deflector. Thus, the electron beam may be quickly emitted to positions spaced apart from each other. For example, immediately after the electron beam is emitted to the first region, the electron beam may be emitted to the second region spaced apart (i.e., not adjacent to) from the first region. Thus, a quick test may be performed.

Figure 8:
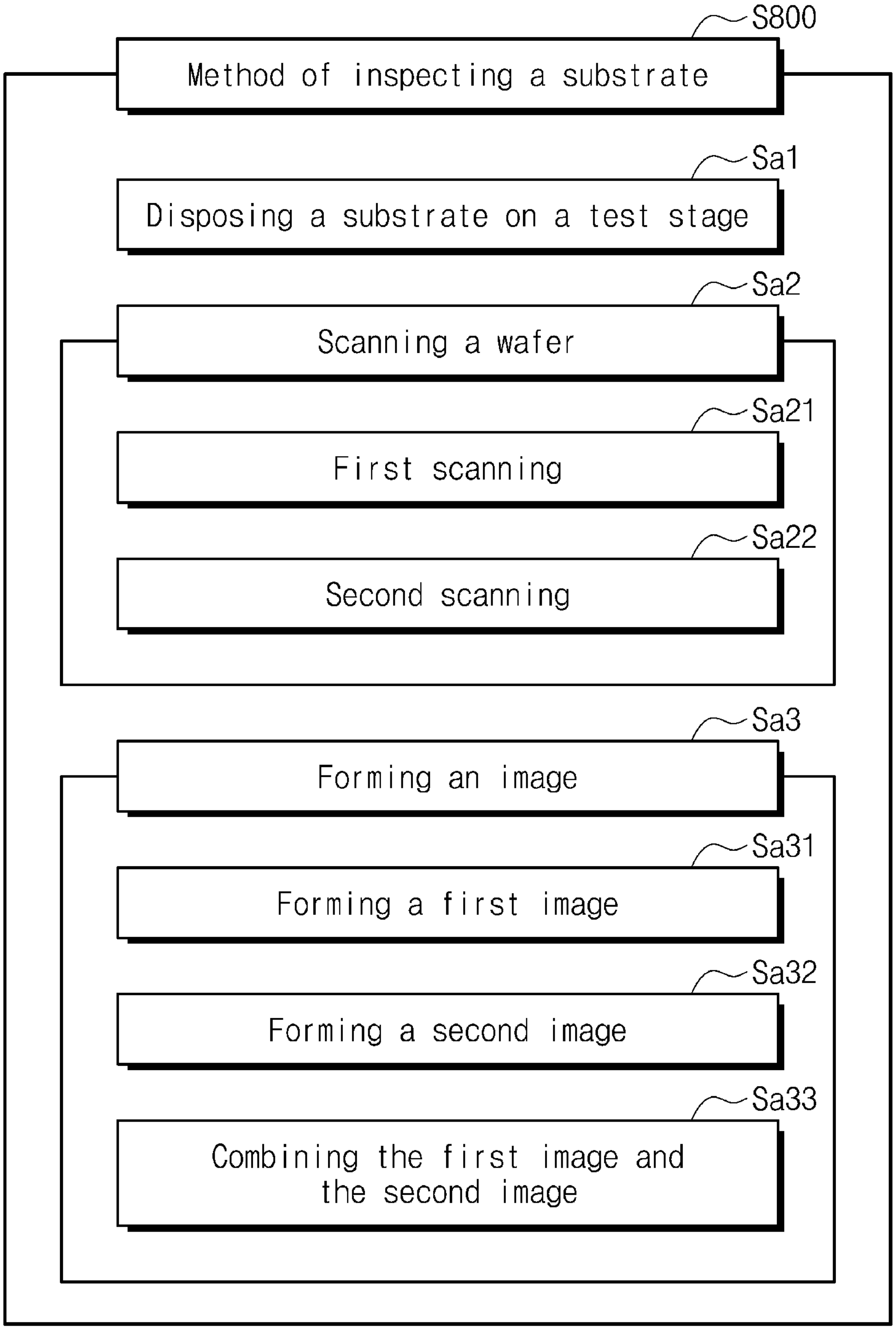
FIG. 8 is a flowchart illustrating a method of inspecting a substrate according to some embodiments of the disclosure.

FIG. 8 is a flowchart illustrating a method of inspecting a substrate according to some embodiments of the disclosure.

Hereinafter, the descriptions that are the same or similar to features described with reference to FIGS. 1 to 7 may be omitted for the purpose of ease and convenience in explanation.

Referring to FIG. 8, a method S800 of inspecting a substrate may be provided. The method S800 of inspecting a substrate may be implemented using the substrate inspection apparatus A (see FIG. 1) described with reference to FIGS. 1 and 2. The method S800 of inspecting a substrate may include disposing a substrate on a test stage in operation Sa1, scanning a wafer in operation Sa2, and forming an image in operation Sa3.

The scanning of the wafer of operation Sa2 may include a first scanning in operation Sa21 and a second scanning in operation Sa22.

The forming of the image of operation Sa3 may include forming a first image in operation Sa31, forming a second image in operation Sa32, and combining the first image with the second image in operation Sa33.

Hereinafter, the method S800 of inspecting a substrate of FIG. 8 will be described in detail with reference to FIGS. 9 to 12.

FIGS. 9, 10, 11 and 12 are diagrams illustrating the method of inspecting a substrate in the flowchart of FIG. 8, according to some embodiments of the disclosure.

Hereinafter, the descriptions that are the same or similar to features described with reference to FIGS. 1 to 7 may be omitted for the purpose of ease and convenience in explanation.

Figure 9:
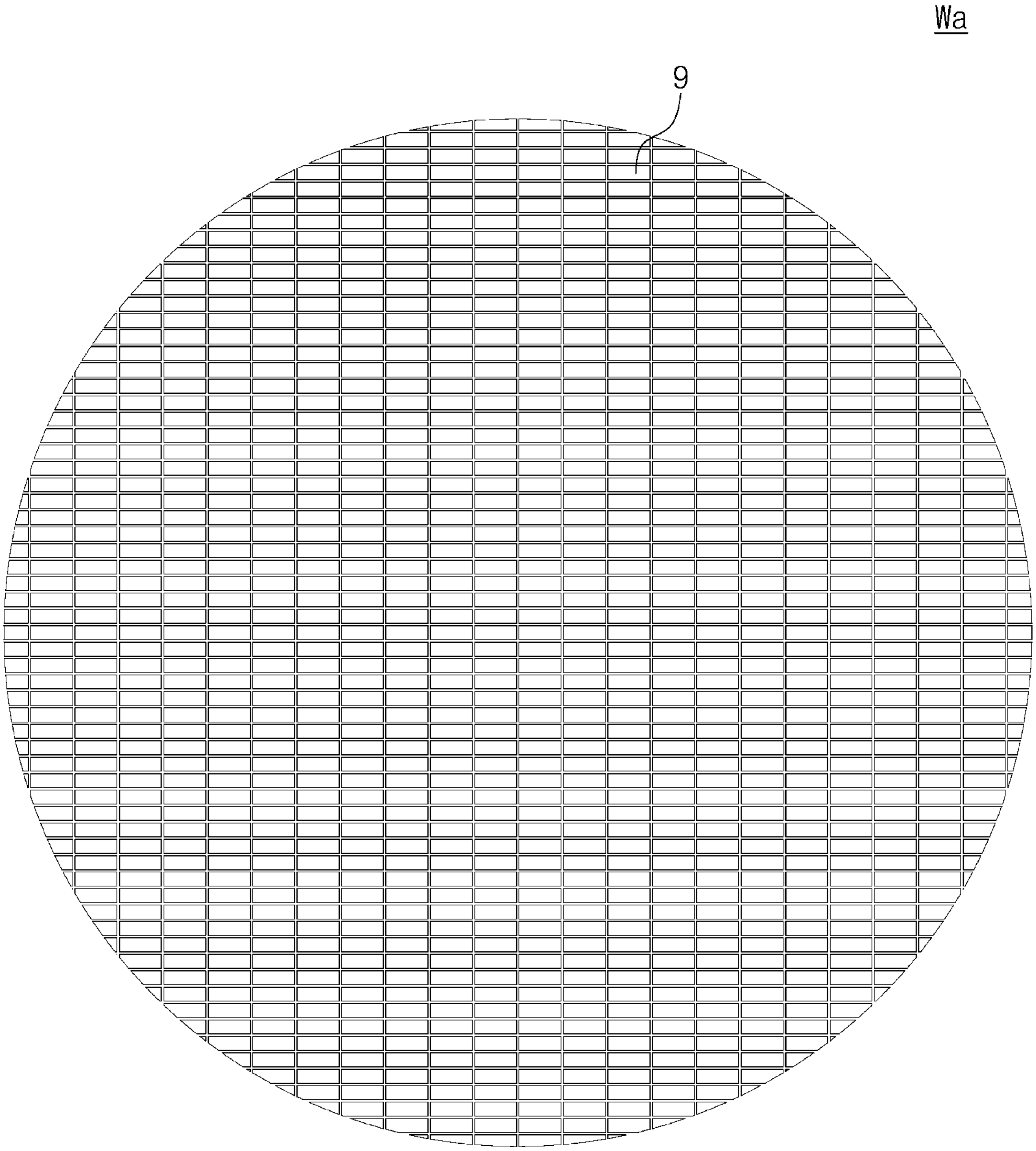
FIGS. 9, 10, 11 and 12 are diagrams illustrating the method of inspecting a substrate in the flowchart of FIG. 8, according to some embodiments of the disclosure.
Figure 10:
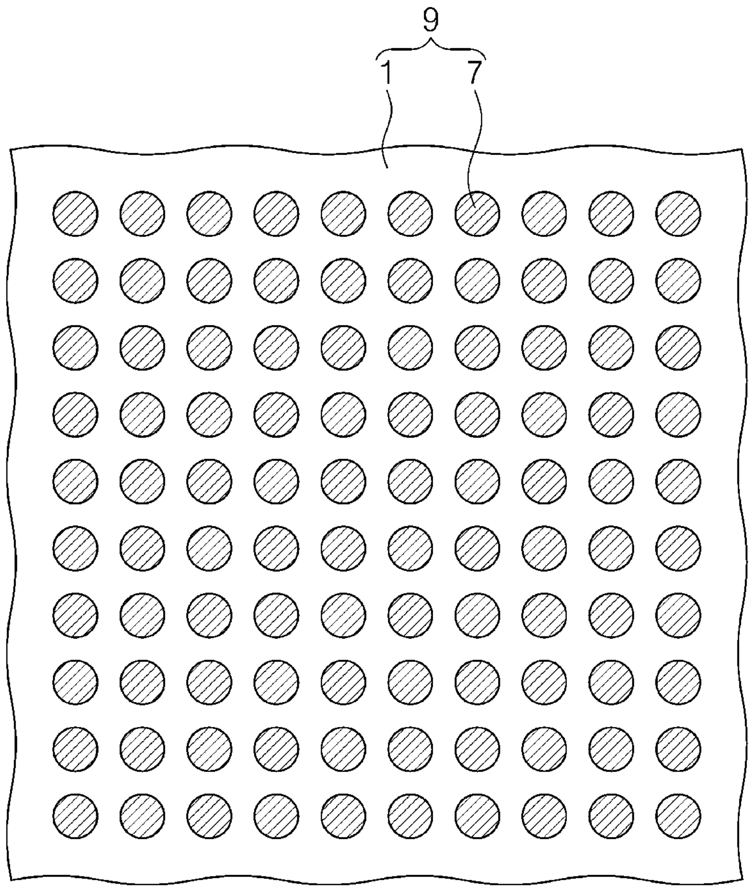

Referring to FIGS. 9 and 10, for example, a substrate Wa may have a wafer shape. The substrate Wa in the wafer shape may include a plurality of dies 9. Each of the dies 9 may include a plurality of regions 7 and a peripheral region 1. For example, each of the plurality of regions 7 may include a capacitor of a DRAM device or a gate contact of a MOSFET. However, embodiments of the disclosure are not limited thereto, and in some embodiments, the plurality of regions 7 may include other components. The peripheral region 1 may mean a region which is not the inspection target. For example, the peripheral region 1 may include a PR. In other words, the peripheral region 1 may be a region covered with the PR. However, embodiments of the disclosure is not limited thereto, and in some embodiments, the peripheral region 1 may include other material.

Figure 11:
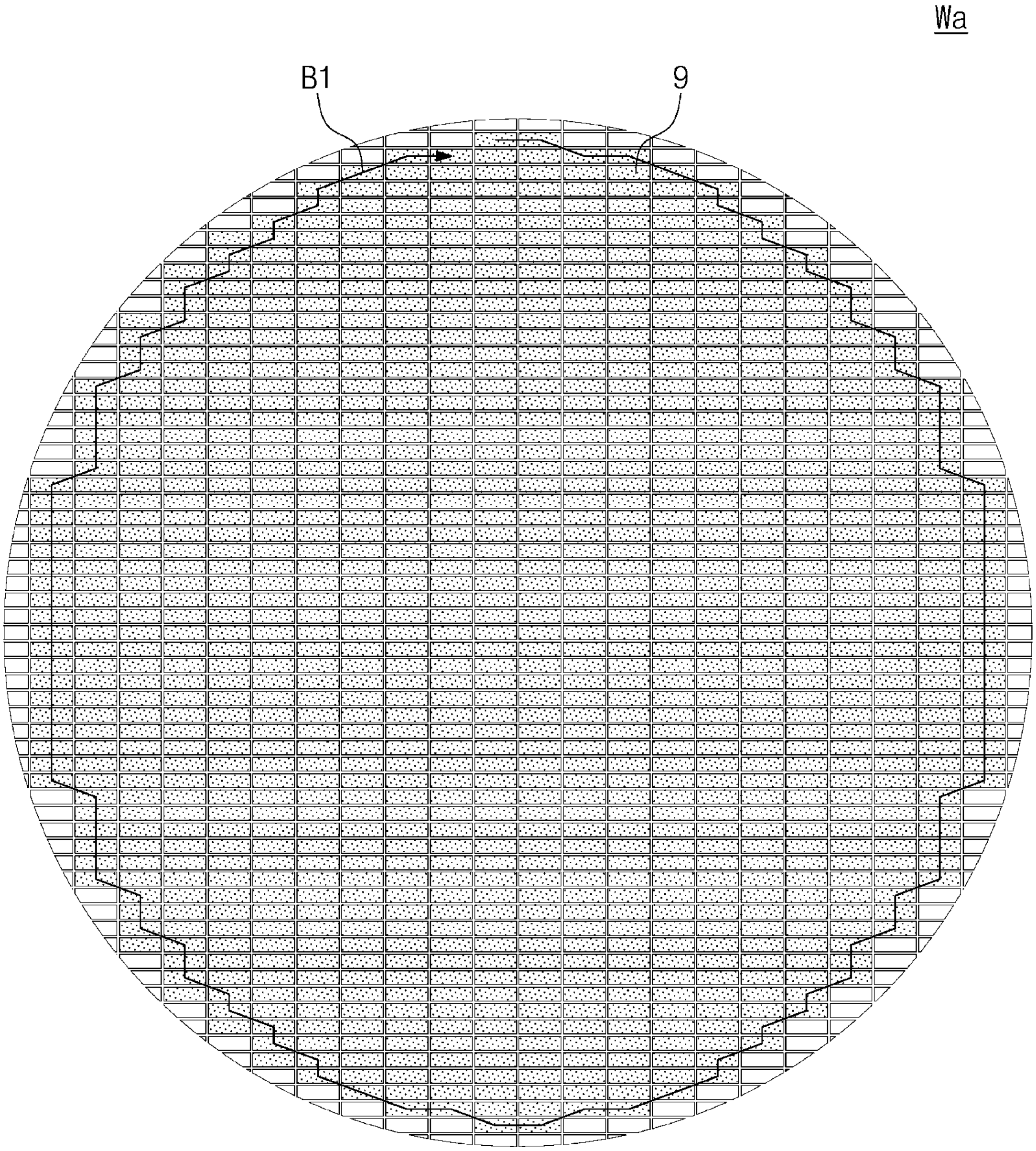

Referring to FIGS. 8 and 11, the first scanning of operation Sa21 may include scanning each of the plurality of dies 9. In the process of scanning each of the dies 9, the plurality of regions 7 (see FIG. 10) may be scanned along the non-linear path, as described with reference to FIG. 7. However, embodiments of the disclosure are not limited thereto. In the first scanning, the plurality of dies 9 may be scanned along a spiral trajectory B1 as shown in FIG. 11, but embodiments of the disclosure are not limited thereto. In the first scanning, all of the plurality of dies 9 may be scanned once.

Figure 12:
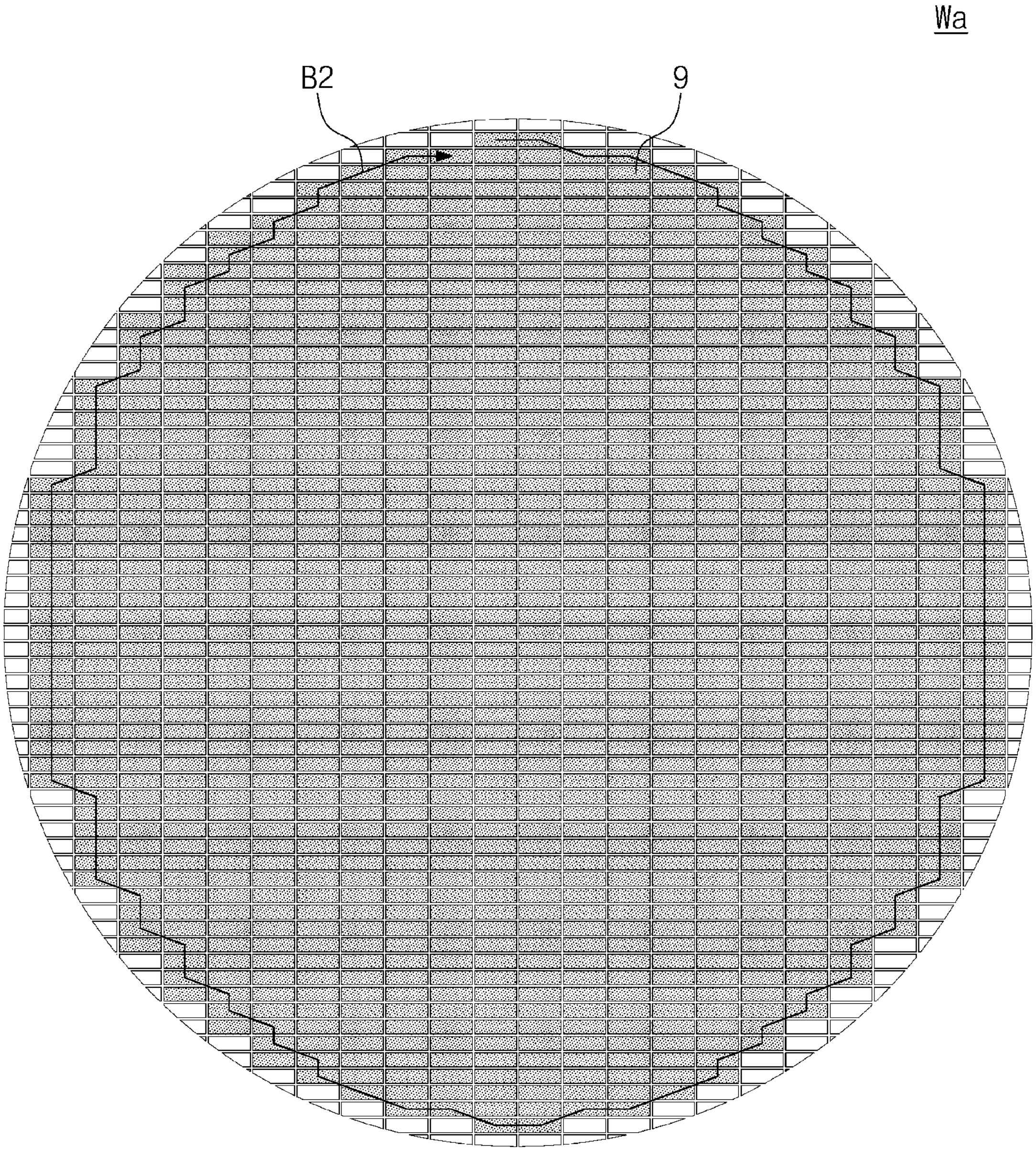

Referring to FIGS. 8 and 12, the second scanning of operation Sa22 may include scanning each of the plurality of dies 9. In the second scanning, the plurality of dies 9 may be scanned along a spiral trajectory B2 as shown in FIG. 12, but embodiments of the disclosure are not limited thereto. The second scanning may be performed after the first scanning is completed. More particularly, the second scanning may be started after the first scanning is performed on all of the plurality of dies 9.

Referring to FIG. 8, the forming of the first image of operation Sa31 may include forming the first image of the plurality of regions using data on results of the first scanning. The first image may be an image on an entire portion of the substrate Wa in the wafer shape.

The forming of the second image of operation Sa32 may include forming the second image of the plurality of regions using data on results of the second scanning. The second image may be an image on an entire portion of the substrate Wa in the wafer shape.

The combining of the first image with the second image of operation Sa33 may include combining or composing the first image and the second image with each other. The first image and the second image may be combined with each other to obtain a total test result image.

In the above embodiments, two scanning processes are performed and described, but embodiments of the disclosure are not limited thereto. In some embodiments, three or more scanning processes may be performed. In this case, three or more images may be combined with each other.

According to the substrate inspection apparatus and the method of inspecting a substrate using the same in the embodiments of the disclosure, the second scanning may be performed after the first scanning of the whole of the wafer is completed. Thus, the electron beam may be prevented from being continuously emitted to a single die and/or a single region. As a result, a time for which charges escape from the PR may be sufficiently secured. In other words, the charges may be prevented from being accumulated in the PR. Thus, shrinkage deformation of the PR may be prevented.

According to the substrate inspection apparatus and the method of inspecting a substrate using the same in the embodiments of the disclosure, the same substrate may be repeatedly scanned a plurality of times to obtain a plurality of images, and the plurality of images may be combined with each other to obtain a single image. Thus, accurate test results may be obtained.

According to the substrate inspection apparatus and the method of inspecting a substrate using the same in the embodiments of the disclosure, a time for which charges escape may be secured to prevent the deformation of the PR.

According to the substrate inspection apparatus and the method of inspecting a substrate using the same in the embodiments of the disclosure, the accurate test results may be obtained.

According to the substrate inspection apparatus and the method of inspecting a substrate using the same in the embodiments of the disclosure, the quick test may be performed.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A method of inspecting a substrate, the method comprising:

providing a substrate on a test stage, the substrate comprising a plurality of regions; and scanning the substrate using a scanning electron microscope (SEM) column comprising an electron gun and a deflector comprising a first deflector configured to cause an electron beam emitted from the electron gun to travel along a first path and a second deflector configured to cause the electron beam emitted from the electron gun to travel along a second path that is different from the first path, wherein the scanning of the substrate comprises:

activating the first deflector and scanning a first region of the plurality of regions of the substrate while the second deflector does not operate;

after scanning the first region, deactivating the first deflector, activating the second deflector, and scanning a second region of the plurality of regions of the substrate, the second region being spaced apart from the first region; and after scanning the second region, deactivating the second deflector, activating the first deflector, and scanning a third region of the plurality of regions of the substrate, the third region being between the first region and the second region, and wherein the third region is adjacent to the first region such that the first region, the second region and the third region are sequentially scanned along a non-linear path.

2. The method of claim 1, wherein the SEM column comprises:

an SEM housing comprising a beam generation space, and wherein the deflector is under the electron gun.

3. The method of claim 2, wherein the scanning of the first region comprises:

emitting the electron beam that travels along the first path by the first deflector onto the first region; and detecting particles emitted from the first region irradiated by the electron beam travelling along the first path, and wherein the scanning of the second region comprises:

emitting the electron beam that travels along the second path by the second deflector onto the second region; and detecting particles emitted from the second region irradiated by the electron beam travelling along the second path.

4. The method of claim 3, wherein the detecting of the particles emitted from the first region comprises detecting secondary electrons emitted from the first region.

5. The method of claim 3, wherein the SEM column further comprises a blocking deflector between the electron gun and the deflector.

6. The method of claim 5, wherein the emitting of the electron beam onto the second region comprises:

after emitting the electron beam onto the first region, blocking the electron beam emitted from the electron gun using the blocking deflector;

activating the second path using the first deflector and the second deflector; and emitting the electron beam along the second path by opening the blocking deflector.

7. The method of claim 1, further comprising:

forming an image using data on scanning results based on the scanning of each of the first region, the second region and the third region.

8. A substrate inspection apparatus, comprising:

a scanning electron microscope (SEM) column comprising:

an SEM housing comprising a beam generation space;

an electron gun in the beam generation space; and a deflector under the electron gun, wherein the deflector comprises:

a first deflector configured to cause an electron beam emitted from the electron gun to travel along a first path; and a second deflector configured to cause the electron beam emitted from the electron gun to travel along a second path that is different from the first path, wherein the substrate inspection apparatus is configured to, by the SEM column:

activate the first deflector and scan a first region of a plurality of regions of a substrate while the second deflector does not operate;

after scanning the first region, deactivate the first deflector, activate the second deflector, and scan a second region of the plurality of regions of the substrate, the second region being spaced apart from the first region; and after scanning the second region, deactivate the second deflector, activate the first deflector, and scan a third region of the plurality of regions of the substrate, the third region being between the first region and the second region, and wherein the third region is adjacent to the first region such that the first region, the second region and the third region are sequentially scanned along a non-linear path.

9. The substrate inspection apparatus of claim 8, wherein each of the first deflector and the second deflector comprises an electromagnet or an electric condenser.

10. The substrate inspection apparatus of claim 8, further comprising:

a condenser lens under the electron gun.

11. The substrate inspection apparatus of claim 10, further comprising:

a blocking deflector between the condenser lens and the deflector.

12. The substrate inspection apparatus of claim 8, further comprising:

a test stage configured to support a substrate.

13. The substrate inspection apparatus of claim 12, further comprising:

a detector configured to detect secondary electrons.

* * * * *